US012588161B2

(12) United States Patent
    Tuan et al.

(10) Patent No.: US 12,588,161 B2
(45) Date of Patent: Mar. 24, 2026

(54) SERVER INFORMATION HANDLING SYSTEM WITH REVERSIBLE AIRFLOW FAN SYSTEM

(71) Applicant: Dell Products L.P., Round Rock, TX (US)

(72) Inventors: Kuang-Jye Tuan, Taipei (TW); Chin-An Huang, Taipei (TW); Achilles Hsu, Hsinchu County (TW)

(73) Assignee: Dell Products L.P., Round Rock, TX (US)

( * ) Notice: Subject to any disclaimer, the term of this patent is extended or adjusted under 35 U.S.C. 154(b) by 247 days.

(21) Appl. No.: 18/375,559

(22) Filed: Oct. 2, 2023

(65) Prior Publication Data

US 2025/0113461 A1      Apr. 3, 2025

(51) Int. Cl.
    *H05K 7/20*      (2006.01)
    *G06F 1/20*      (2006.01)
(52) U.S. Cl.
    CPC ........... *H05K 7/20172* (2013.01); *G06F 1/20* (2013.01); *H05K 7/20736* (2013.01)
(58) Field of Classification Search
    CPC ... H05K 7/20172; H05K 7/20736; G06F 1/20
    See application file for complete search history.

(56) References Cited

U.S. PATENT DOCUMENTS

| | | | | |
|---|---|---|---|---|
| 7,408,774 B1 * | 8/2008 | Anderl | ...................... | G06F 1/20 |
| | | | | 415/60 |
| 7,675,747 B1 * | 3/2010 | Ong | ................... | H05K 7/20727 |
| | | | | 361/679.48 |
| 8,385,064 B1 * | 2/2013 | Smith | ................ | H05K 7/20727 |
| | | | | 361/679.48 |
| 9,055,693 B2 * | 6/2015 | Arreola | .............. | H05K 7/20172 |
| 9,458,854 B2 * | 10/2016 | Cananzi | .............. | F04D 25/0693 |
| 11,914,795 B1 * | 2/2024 | Krishnakumar | ...... | G06F 3/0202 |
| 2004/0130872 A1 * | 7/2004 | Cravens | .................... | G06F 1/20 |
| | | | | 361/695 |
| 2010/0284781 A1 * | 11/2010 | Zwinger | ................... | G06F 1/20 |
| | | | | 361/679.48 |
| 2015/0177750 A1 * | 6/2015 | Bailey | ................ | G05D 23/1932 |
| | | | | 700/275 |
| 2016/0174409 A1 * | 6/2016 | Mease | ................ | H05K 7/20172 |
| | | | | 361/695 |
| 2019/0069442 A1 * | 2/2019 | Pav | ........................... | G06F 1/20 |
| 2019/0147560 A1 * | 5/2019 | Ray | ....................... | H04N 25/40 |
| | | | | 382/317 |
| 2021/0118342 A1 * | 4/2021 | Chen | ........................ | G06T 11/00 |
| 2022/0221916 A1 * | 7/2022 | Eiland | ....................... | G06F 1/20 |
| 2023/0066170 A1 * | 3/2023 | Rivnay | ................ | G11B 33/128 |
| 2024/0102491 A1 * | 3/2024 | Chen | ..................... | F04D 29/522 |

* cited by examiner

*Primary Examiner* — Michael A Matey
(74) *Attorney, Agent, or Firm* — Terrile, Cannatti & Chambers, LLP; Stephen A. Terrile

(57)      ABSTRACT

A fan system for an information handling system. The fan system includes a fan module, the fan module being configured to mount in a fan bay of the information handling system in a plurality of orientations; and, a fan orientation sensor, the fan orientation sensor being configured to detect an orientation of the fan module when mounted within the fan bay of the information handling system.

18 Claims, 12 Drawing Sheets

600

610          610          610

AIR FLOW
410

430

424

405

422

420

400

AIR FLOW
412

430

424

405

422

420

700

700

710

SERVER INFORMATION HANDLING SYSTEM WITH REVERSIBLE AIRFLOW FAN SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

In one embodiment, the invention relates to a fan system for an information handling system comprising a fan module, the fan module being configured to mount in a fan bay of the information handling system in a plurality of orientations; and, a fan orientation sensor, the fan orientation sensor being configured to detect an orientation of the fan module when mounted within the fan bay of the information handling system.

In another embodiment, the invention relates to an information handling system comprising: information handling system comprising: a chassis; a processor mounted within the chassis; a data bus coupled to the processor; a storage medium coupled to the data bus; and, a fan system mounted within a fan bay of the chassis, the fan system comprising a fan module, the fan module being configured to mount in a fan bay of the information handling system in a plurality of orientations; and, a fan orientation sensor, the fan orientation sensor being configured to detect an orientation of the fan module when mounted within the fan bay of the information handling system.

In another embodiment, the invention relates to a server rack comprising: a server mounting component, a front of the server mounting component facing a cold aisle of a data center and a rear of the server mounting component facing a hot aisle of the data center; and, an information handling system attached to the server mounting component, the information handling system comprising: a chassis; a processor mounted within the chassis; a data bus coupled to the processor; a storage medium coupled to the data bus; and, a fan system mounted within a fan bay of the chassis, the fan system comprising a fan module, the fan module being configured to mount in a fan bay of the information handling system in a plurality of orientations; and, a fan orientation sensor, the fan orientation sensor being configured to detect an orientation of the fan module when mounted within the fan bay of the information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
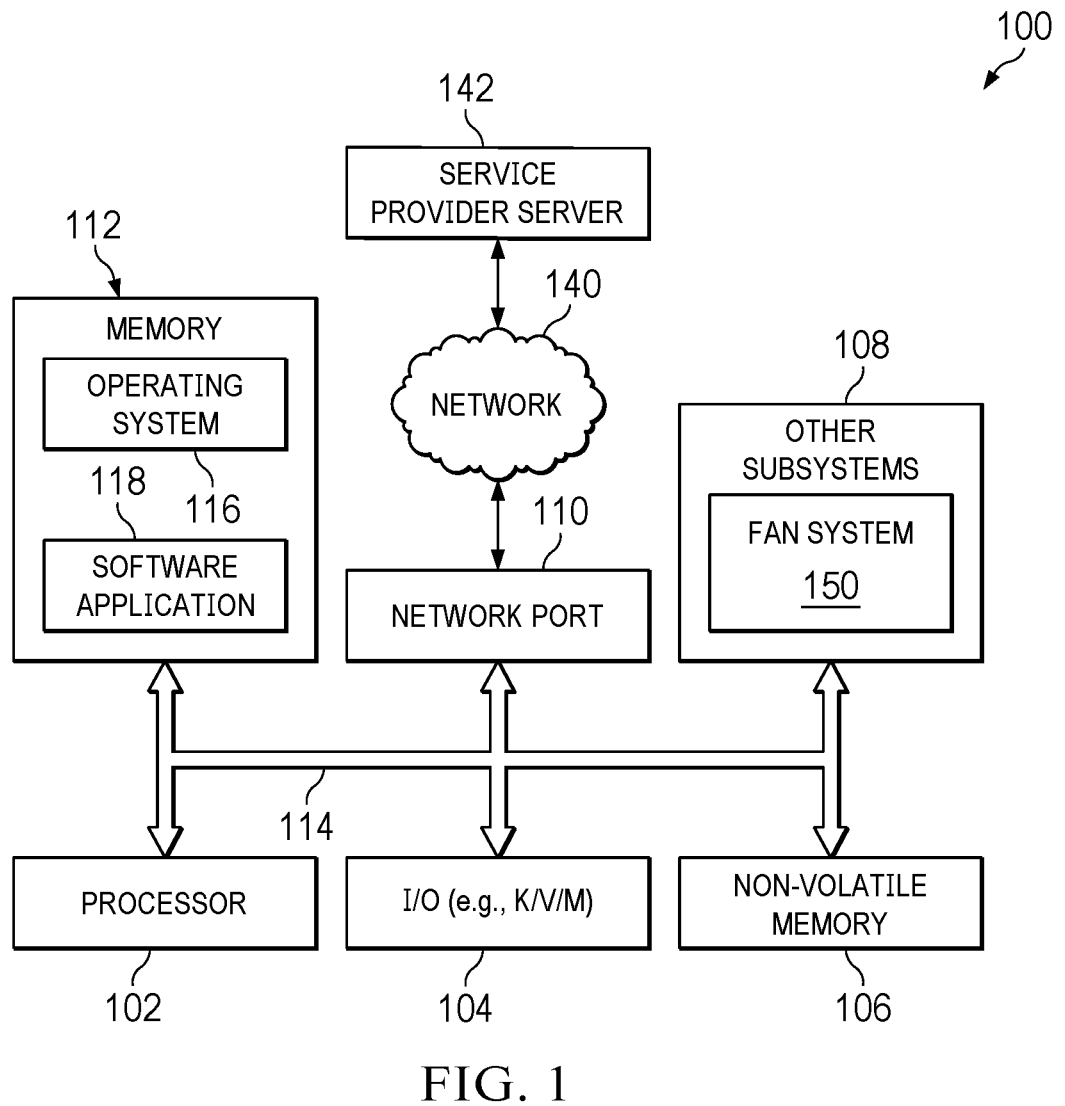
FIG. 1 shows a general illustration of components of an information handling system as implemented in the system and method of the present invention.

Various aspects of the disclosure include an appreciation that it is desirable to provide server type information handling systems with flexibility to support different working environments. Various aspects of the disclosure include an appreciation that this flexibility can include an ability to configure a cooling solution for the server type information handling system into different airflow directions so as to easily and quickly support datacenter cold aisle or hot aisle working environments.

A system and method are disclosed for providing server type information handling systems with a common configurable fan system which supports Normal Airflow (NAF) and Reversed Airflow (RAF) solution. Such a fan system advantageously lowers system complexity and production costs. In certain embodiments, the configurable fan system may be used within a common information handling system chassis. In certain embodiments, the configurable fan system includes fan cables, a fan orientation sensor and one or more fan modules which support cold aisle and hot aisle cooling configurations. In certain embodiments, the configurable fan system easily converts fan module orientation and detects the orientation of the fan modules. In certain embodiments, the different orientations are 180 degrees reversed from each other. In certain embodiments, the configurable fan system may be installed within a common chassis fan bay.

In certain embodiments, the fan orientation sensor includes a fan sensor circuit which detects fan module orientation. In certain embodiments, the fan module includes a reflective portion which is used by the fan orientation sensor to detect fan module orientation. In certain embodiments, different reflective portions are used on respective sides of a fan housing. In certain embodiments, the fan orientation sensor interacts with the reflective material to determine a fan module orientation.

In certain embodiments, the fan orientation sensor includes an orientation indicia. In certain embodiments, the orientation indicia includes a visible indicator such as a light emitting diode (LED) indicator. In certain embodiments, a signal generated by the fan sensor circuit triggers the orientation indicia to signal a user regarding whether the fan module is installed in a normal airflow orientation or a reverse airflow orientation. In certain embodiments, the orientation indicia uses different colors to indicate whether the fan module is installed in the normal airflow orientation or the reverse airflow orientation. In certain embodiments, the fan sensor circuit is powered with a battery. In certain embodiments, the battery includes a CMOS backup battery installed on a motherboard of the information handling system. In certain embodiments, when a cover of a chassis of the information handling system is closed, the orientation indicia is turned off to save energy. In certain embodiments, sensor data generated by the fan sensor circuit is saved to provide user warning message during system boot up to indicate a fan module orientation.

Such a configurable fan system solution advantageously drives cost reduction. Such a configurable fan system allows use of a single information handling system chassis with a plurality of fan module orientations. Such a configurable fan system advantageously allows common cable fan bay hardware for different system level airflow directions, thus saving total material cost. Such a configurable fan system provides multiple airflow orientations without a need for orientation specific hardware. Such a configurable fan system enables a simplified chassis structure which reduces bill of materials (BOM) complexity as well as logistic management, and material costs.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more fan systems 150 for cooling the information handling system 100.

In certain embodiments, the information handling system 100 comprises a server type information handling system. In certain embodiments, the server type information handling system comprises a rack server type information handling system. As used herein, a rack server type information handling system broadly refers to an information handling system which is physically configured to be mounted within a server rack.

In certain embodiments, the information handling system 100 includes a fan system 150. In certain embodiments, the fan system 150 includes a common configurable fan system which supports Normal Airflow (NAF) and Reversed Airflow (RAF) solution. Such a common configurable fan system advantageously lowers system complexity and production costs. In certain embodiments, the configurable fan system may be used within a common information handling system chassis. In certain embodiments, the configurable fan system 150 includes a fan orientation sensor and one or more fan modules which support cold aisle and hot aisle cooling configurations. In certain embodiments, the configurable fan system 150 includes fan cables. In certain embodiments a single set of fan cables is used regardless of the orientation in which the fan system is mounted within a chassis fan bay. In certain embodiments, the configurable fan system 150 easily converts fan module orientation and detects the orientation of the fan modules. In certain embodiments, the different orientations are 180 degrees reversed from each other. In certain embodiments, the configurable fan system may be installed within a common chassis fan bay.

In certain embodiments, the fan orientation sensor includes a fan sensor circuit which detects fan module orientation. In certain embodiments, the fan module includes a reflective portion which is used by the fan orientation sensor to detect fan module orientation. In certain embodiments, the reflective portion is provided by attaching reflective material to a fan housing of the fan module. In certain embodiments, different reflective material is used on respective sides of a fan housing. In certain embodiments, the fan orientation sensor interacts with the reflective material to determine a fan module orientation.

In certain embodiments, the fan orientation sensor includes an orientation indicia. In certain embodiments, the orientation indicia includes a visible indicator such as a light emitting diode (LED) indicator. In certain embodiments, a signal generated by the fan sensor circuit triggers the orientation indicia to signal a user regarding whether the fan module is installed in a normal airflow orientation or a reverse airflow orientation. In certain embodiments, the orientation indicia uses different colors to indicate whether the fan module is installed in the normal airflow orientation or the reverse airflow orientation. In certain embodiments, the fan sensor circuit is powered with a battery. In certain embodiments, the battery includes a CMOS backup battery installed on a motherboard of the information handling system. In certain embodiments, when a cover of a chassis of the information handling system is closed, the orientation indicia is turned off to save energy. In certain embodiments, sensor data generated by the fan sensor circuit is saved to provide user warning message during system boot up to indicate a fan module orientation.

Figure 2:
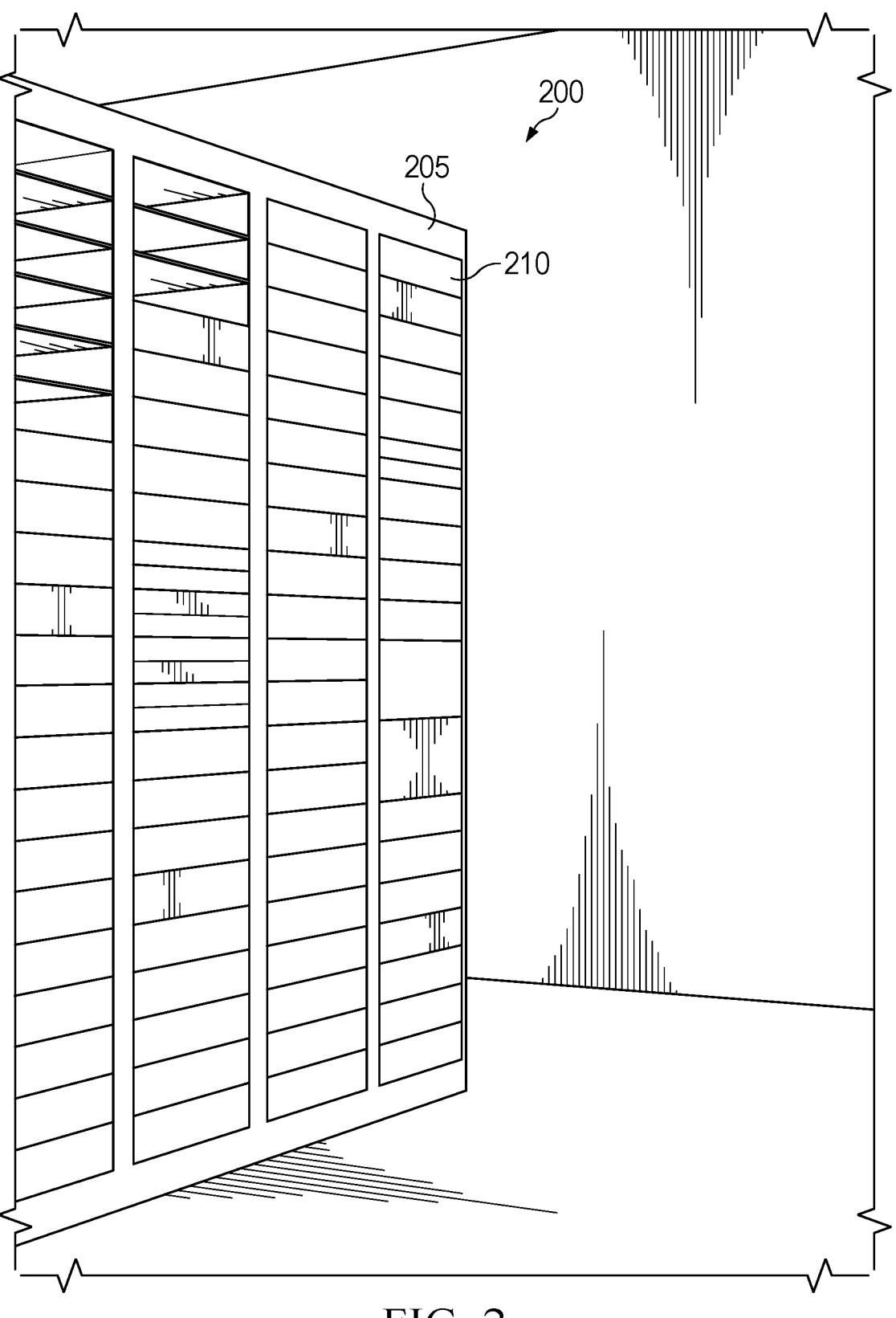
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks are arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and rear aisles via which the infrastructure (e.g., data and power cabling) of the IT environment can be accessed. The front aisles are often referred to as cold aisles and the rear aisles are often referred to as hot aisles. Within data centers, the plurality of rack systems are often arranged in alternating hot and cold aisles such that pairs of front rows face each other and pairs of rear rows face each other. With such an arrangement, the front of servers contained within oppositely facing pairs of rack systems may be accessed via a single cold aisle and the rear of servers contained within oppositely facing pairs of rack systems may be accessed via a single hot aisle.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1U rack unit, a 2U rack unit and a 4U rack unit. In general, a 1U rack unit is substantially (i.e., +/−20%) 1.75" high, a 2U rack unit is substantially (i.e., +/−20%) 3.5" high and a 4U rack height is substantially (i.e., +/−20%) 7.0" high.

Figure 3A:
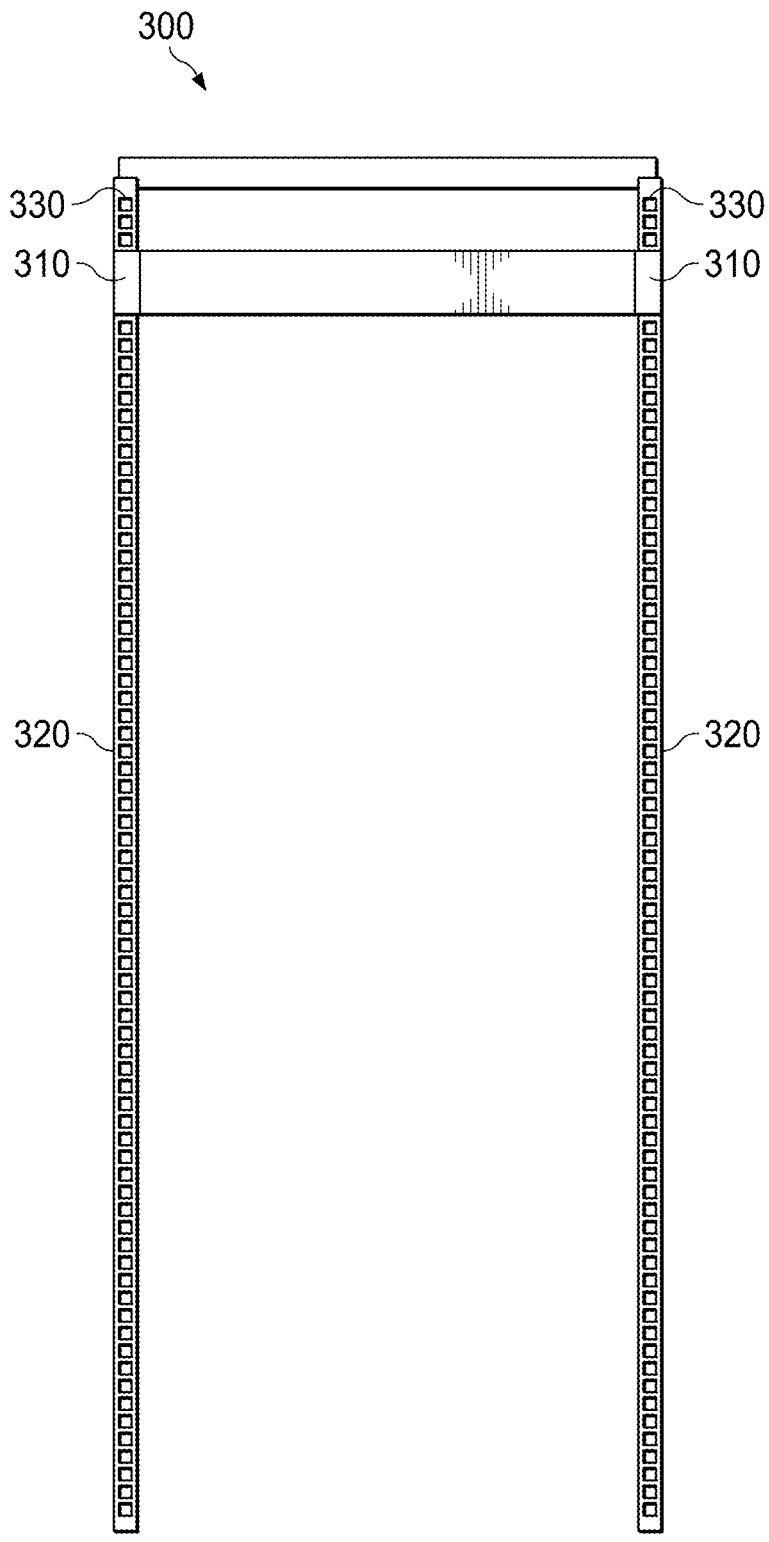
FIGS. 3A, 3B and 3C show a rack front view, a rack side view, and a rack side view with an information handling system in an accessible position.
Figure 3C:
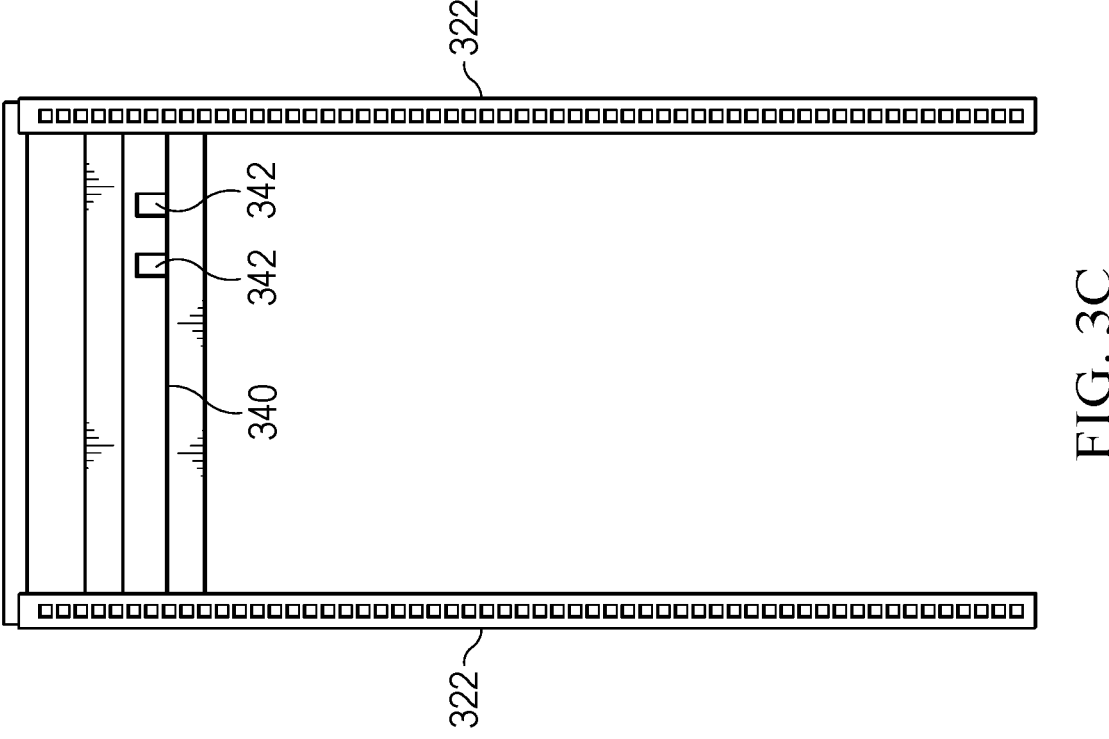
Figure 3B:
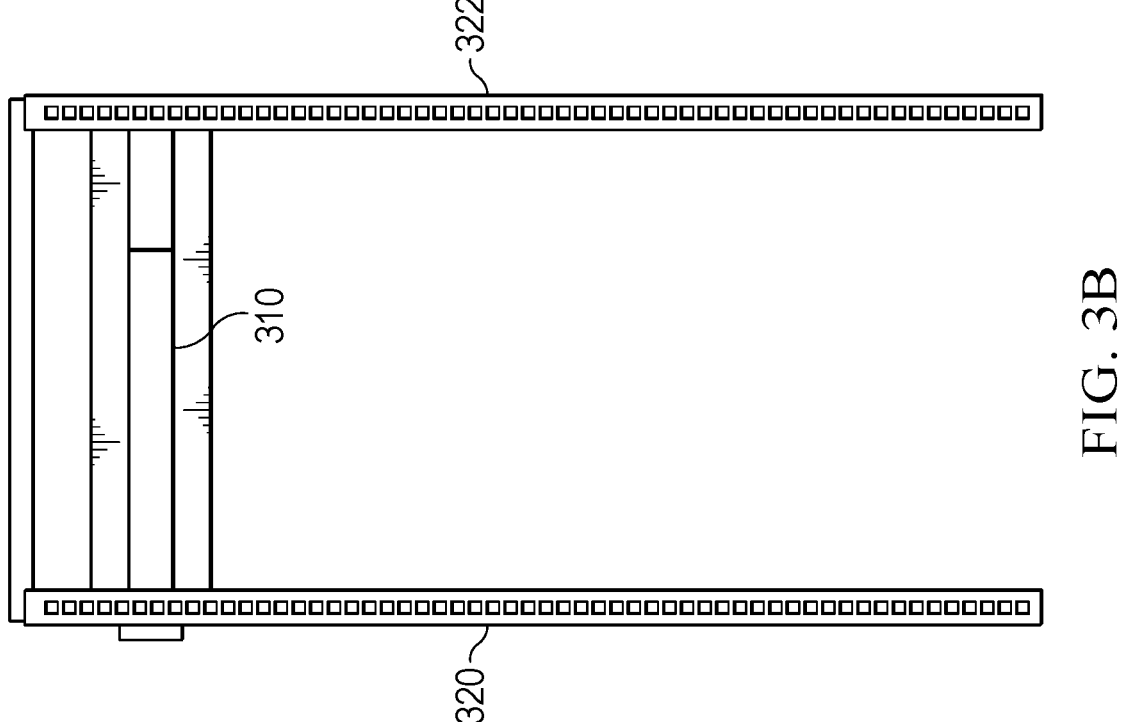

FIGS. 3A, 3B and 3C show a rack front view, a rack side view, and a rack rear view with an information handling system. In certain embodiments, the front of the rack faces a cold aisle of a data center. In certain embodiments, the rear of the rack faces a hot aisle of a data center. A first server mounting component 310 is attached to one side of the rack and a second server mounting component 310 is attached to another side of the rack. In certain embodiments, a front of the server mounting component faces a cold aisle of a data center and a rear of the server mounting component faces a hot aisle of the data center. In certain embodiments, the first server mounting component is attached to a first front rack post 320 and a first rear rack post 322 of the rack 300. In certain embodiments, the second server mounting component is attached to a second front rack post 320 and a second rear rack post 322 of the rack 300. In certain embodiments, the first server mounting component 310 is attached via the mounting apertures 330. In certain embodiments, the second server mounting component is attached via the mounting apertures 330. In certain embodiments, a rear component 340 is attached between the first server mounting component 310 and the second server mounting component 310. In certain embodiments, the rear component 340 includes one or more blind-mate alignment components 342.

In certain embodiments, a rack includes a plurality of vertically arranged mounting components. In certain embodiments, some or all of the vertically arranged mounting components are adapted to mount respective rack server type information handling systems to the rack. In certain embodiments, the server mounting components are configured to correspond to particular rack unit heights.

Figure 4A:
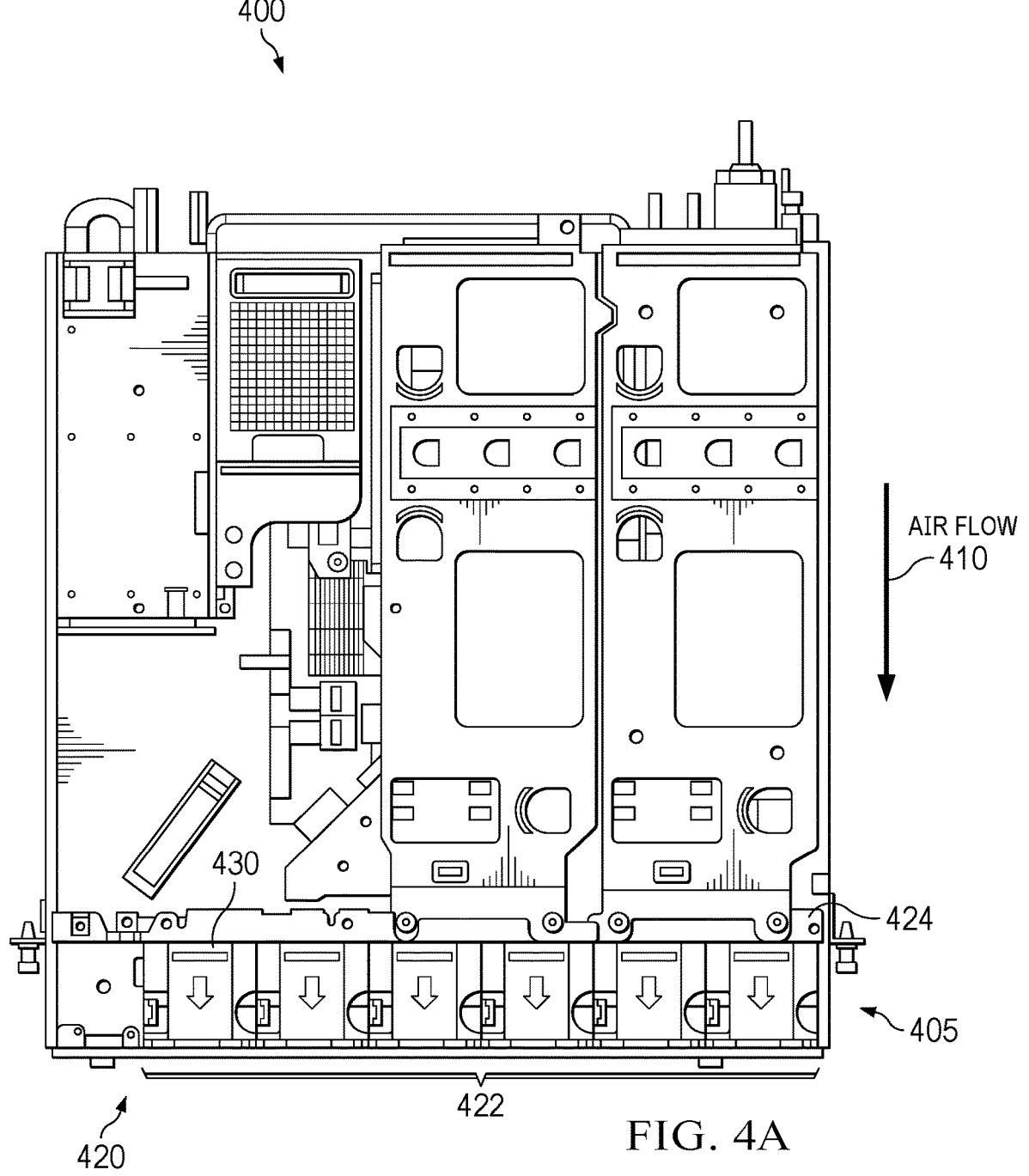
FIGS. 4A and 4B, generally referred to as FIG. 4, show top views of a server type information handing system which include a fan system in accordance with the present disclosure.
Figure 4B:
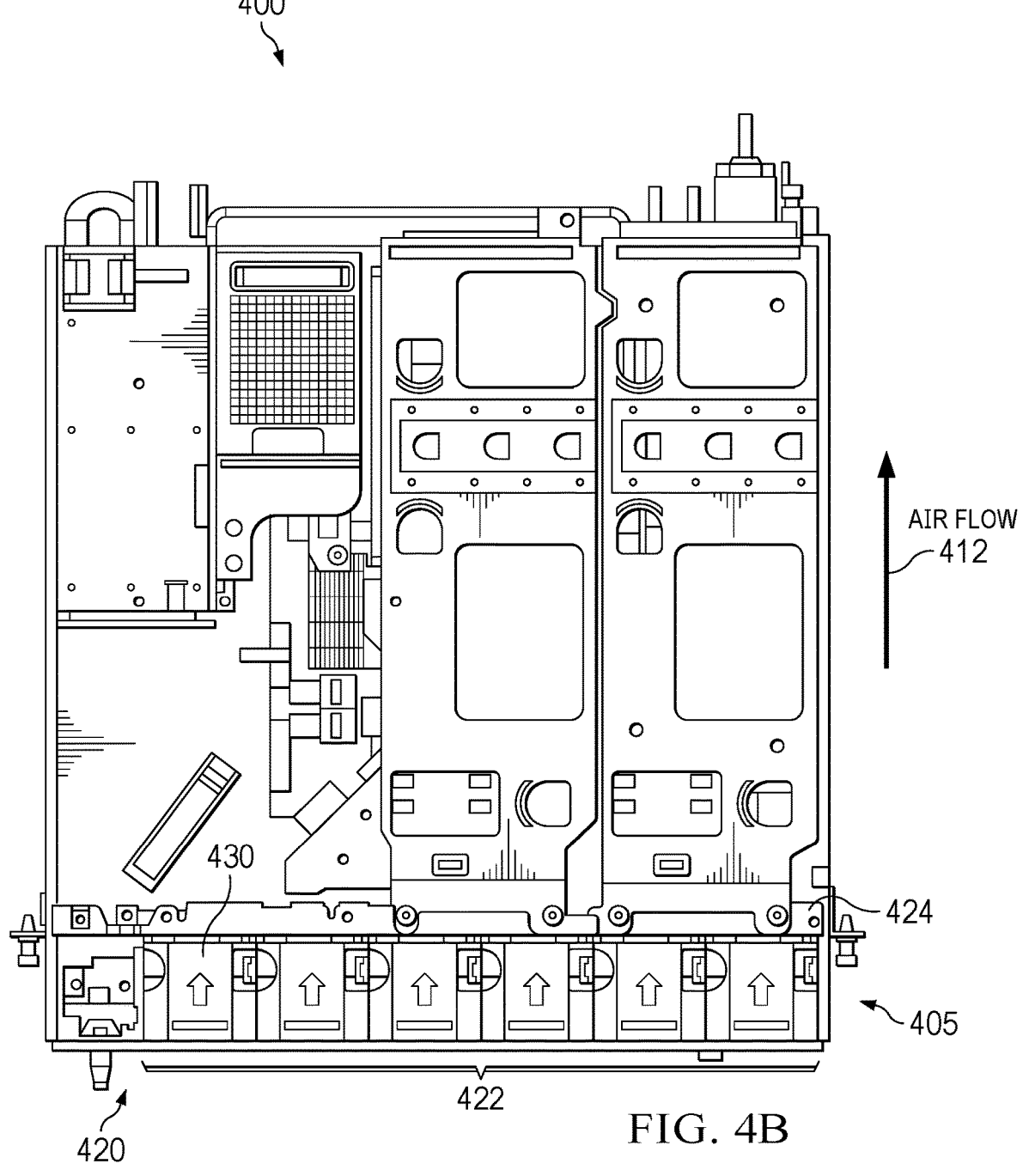
Figure 5A:
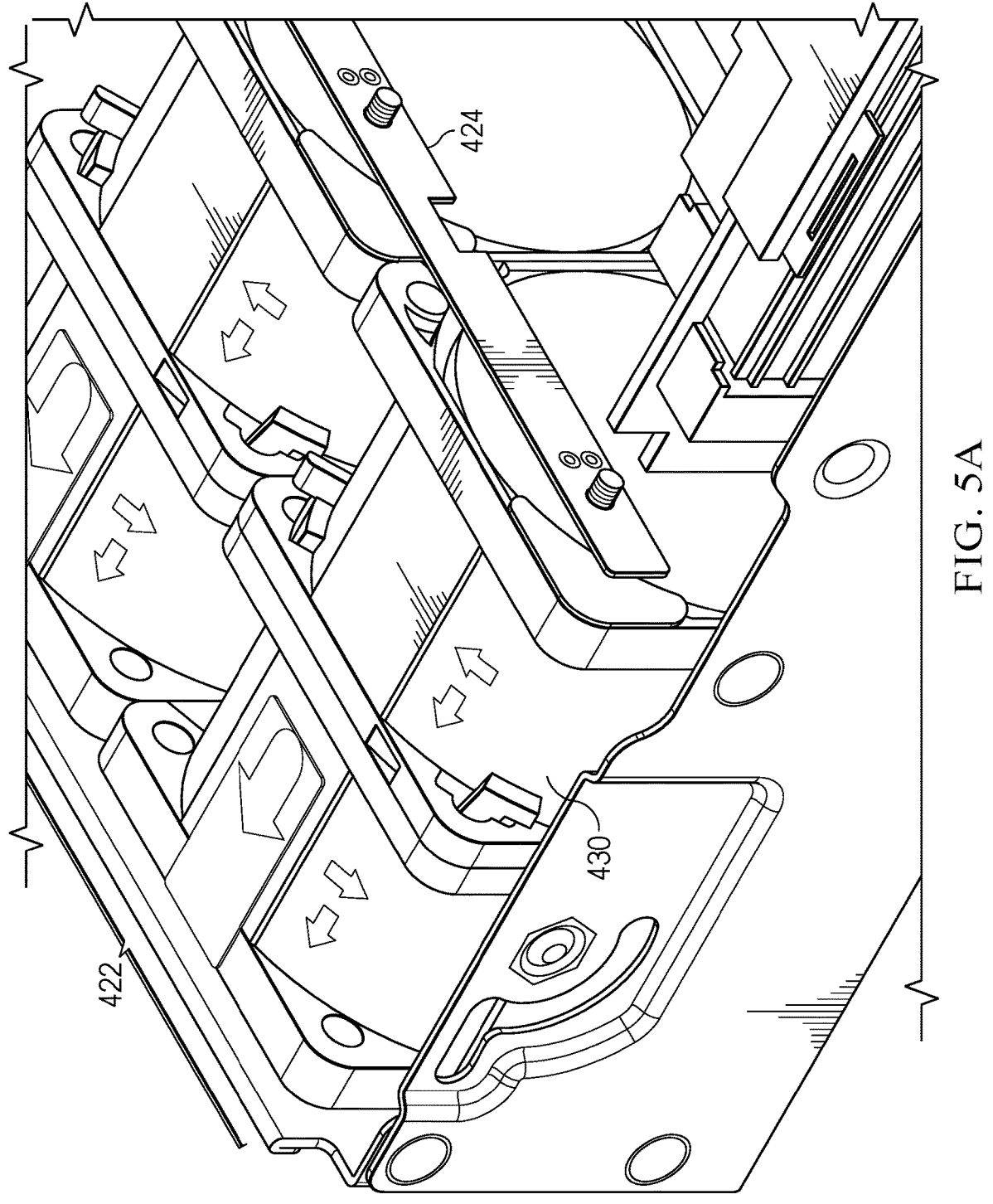
FIGS. 5A and 5B, generally referred to as FIG. 5, show a perspective view and a side view of portion of a fan system in accordance with the present disclosure.
Figure 5B:
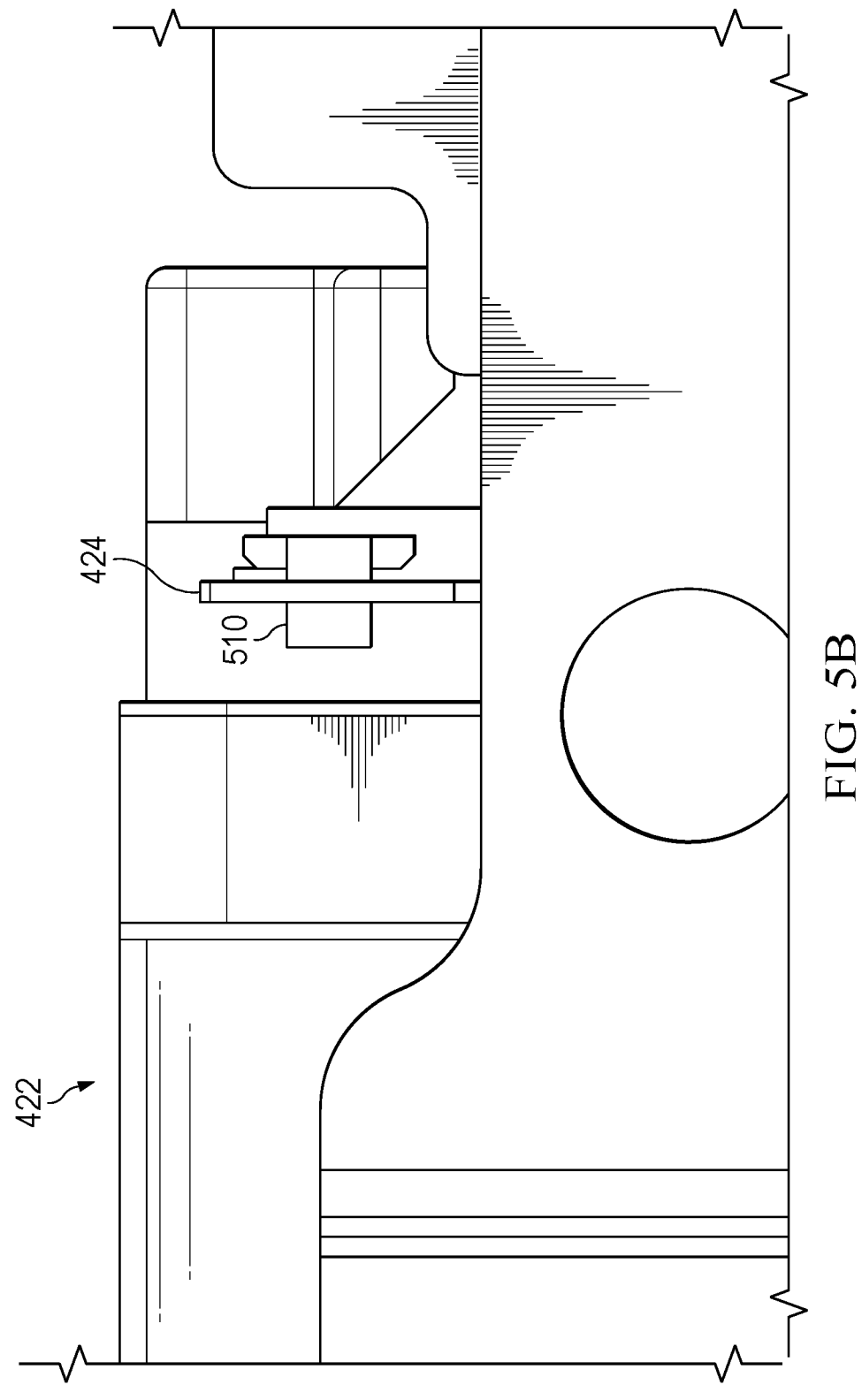

FIGS. 4A and 4B, generally referred to as FIG. 4, show top views of a server type information handing system 400 which include a common configurable fan system 405 in accordance with the present disclosure. FIGS. 5A and 5B, generally referred to as FIG. 5, show a perspective view and a side view of portion of a fan system in accordance with the present disclosure.

In certain embodiments, the common configurable fan system 405 supports a normal airflow orientation 410 and a reversed airflow orientation 412. Such a common configurable fan system 405 advantageously lowers system complexity and production costs. In certain embodiments, the configurable fan system 405 may be used within a common information handling system chassis. In certain embodiments, the common configurable fan system 405, a fan controller portion 420, a fan module portion 422 and a fan orientation sensor 424. In certain embodiments, the fan module portion 422 includes one or more fan modules 430. In certain embodiments the common configurable fan system 405 supports cold aisle and hot aisle cooling configurations. In certain embodiments, the configurable fan system 405 easily converts fan module orientation and detects the orientation of the fan modules. In certain embodiments, the different orientations are 180 degrees reversed from each other. In certain embodiments, the fan controller portion 420 is configured use a single connector when mounted in a plurality of orientations within a common chassis fan bay. In various embodiments, the fan controller portion 420 is included within a fan board contained within the fan system 405, a fan controller embedded within a motherboard of the information handling system, or a combination thereof. In certain embodiments, the configurable fan system 405 is installed within a common chassis fan bay.

Figures 6A, 6B, 6C:
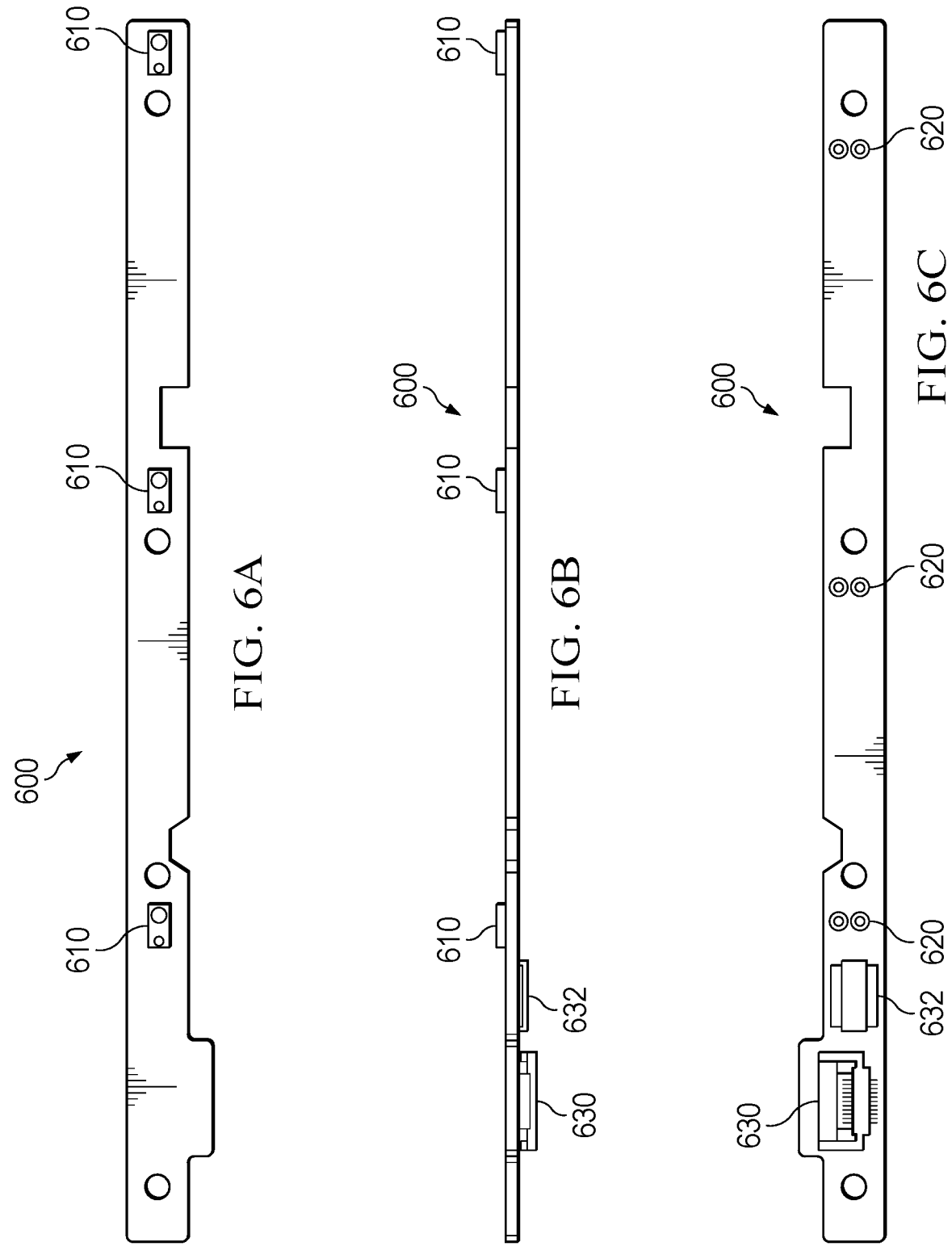
FIGS. 6A, 6B and 6C, generally referred to as FIG. 6, show front, top and review views of a fan sensor circuit board of a fan orientation sensor in accordance with the present disclosure.

FIGS. 6A, 6B and 6C, generally referred to as FIG. 6, show front, top and review views of a fan sensor circuit board 600 of a fan orientation sensor in accordance with the present disclosure. In certain embodiments, the fan sensor circuit board 600 detects fan module orientation. In certain embodiments, the width of the fan sensor circuit board 600 substantially (i.e., +/−20) corresponds to the width of the fan module portion of the fan system.

In certain embodiments, the fan sensor circuit board 600 includes one or more light sensor modules 610. In certain embodiments the light sensor modules 610 include an ambient light sensor component. In certain embodiments, the light sensor module 610 combines an infrared emitter, photo detector for proximity and ambient light, a signal processing integrated circuit, and an analog to digital converter. In certain embodiments, the fan sensor circuit board 600 includes a plurality of light sensor modules 610 spaced across a front portion of the fan sensor circuit board 600. In certain embodiments, the fan sensor circuit board 600 includes three light sensor modules 610. In certain embodiments, each light sensor module 610 senses light reflected off of a portion of a fan module portion. In certain embodiments, the fan module includes reflective material which is used by the fan orientation sensor to detect fan module orientation. In certain embodiments, different reflective material is used on respective sides of a fan housing. In certain embodiments, the fan sensor circuit interacts with the reflective material to determine a fan module orientation.

In certain embodiments, the fan sensor circuit board 600 includes one or more orientation indicia 620. In certain embodiments, the orientation indicia 620 includes a visible indicator such as a light emitting diode (LED) indicator. In certain embodiments, a signal generated by the fan sensor circuit triggers the orientation indicia to signal a user regarding whether the fan module is installed in a normal airflow orientation or a reverse airflow orientation. In certain embodiments, the orientation indicia uses different colors to indicate whether the fan module is installed in the normal airflow orientation or the reverse airflow orientation. In certain embodiments, the fan sensor circuit board 600 is powered with a battery. In certain embodiments, the battery includes a CMOS backup battery installed on a motherboard of the information handling system. In certain embodiments, when a cover of a chassis of the information handling system is closed, the orientation indicia is turned off to save energy. In certain embodiments, sensor data generated by the fan sensor circuit is saved to provide user warning message during system boot up to indicate a fan module orientation.

In certain embodiments, the fan sensor circuit board 600 includes one or both of a first connector 630 and a second connector 632. In certain embodiments, one or both of the first connector 630 and the second connector 632 are used to electrically couple the fan sensor circuit board 600 with a fan controller portion, a battery, or a combination thereof.

Figure 7A:
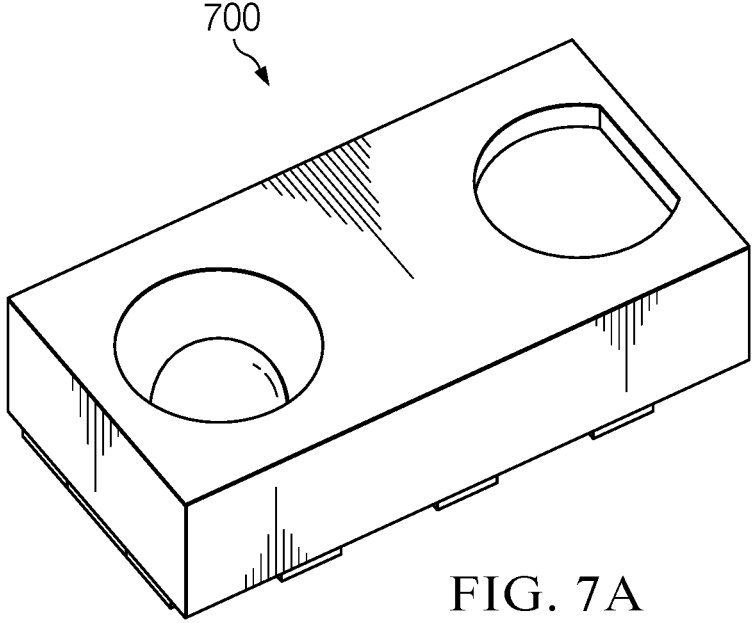
FIGS. 7A and 7B, generally referred to as FIG. 7, show top and bottom perspective views of a proximity sensor module of a fan system in accordance with the present disclosure.
Figure 7B:
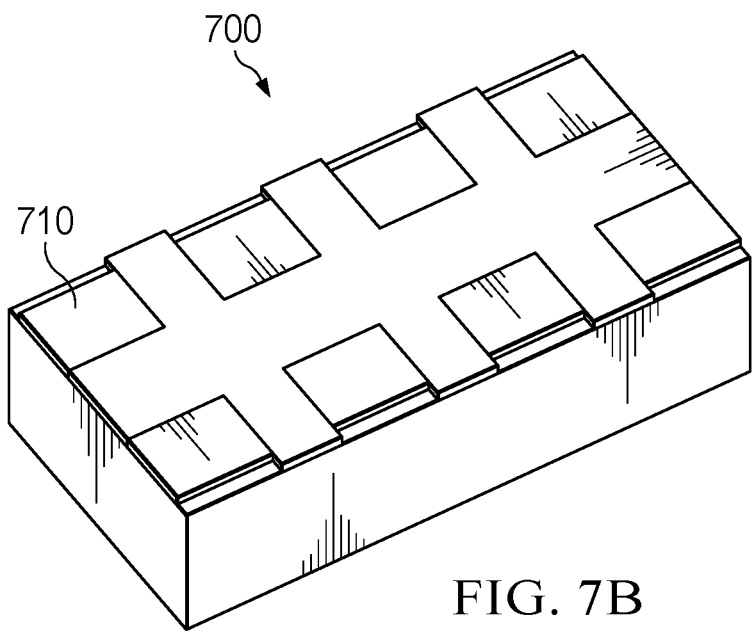

FIGS. 7A and 7B, generally referred to as FIG. 7, show top and bottom perspective views of a proximity sensor module 700 of a fan system in accordance with the present disclosure. In certain embodiments, the proximity sensor module 700 corresponds to light sensor module 610. In certain embodiments, the fan orientation sensor uses the proximity sensor module 700 to detect light generated by a light source such as an infrared emitter. In certain embodiments, the proximity sensor module 700 is addressed via one set of inter integrated circuit (I2C) addresses. In certain embodiments, when a fan orientation sensor includes a plurality of proximity sensor modules 700, an orientation sensor circuit board is configured with an I2C multiplexor to enable access to each of the proximity sensor modules.

In certain embodiments, the proximity sensor module 700 has a power consumption of IDD=0.3 mA and IRED=200 mA*duty cycle (thus the IRED power consumption depends on response time). In certain embodiments, the proximity sensor module 700 pins 710 are defined as Pin1 GND, Pin2 Anode, Pin3 SDAT1, Pin4 SCLK1, Pin5 SDAT2, Pin6 SCLK2, Pin7 SDAT3, Pin8 SCLK4. In certain embodiments, the proximity sensor module 700 does not use INT and CATHODE pins as these pins are unnecessary.

Figure 8A:
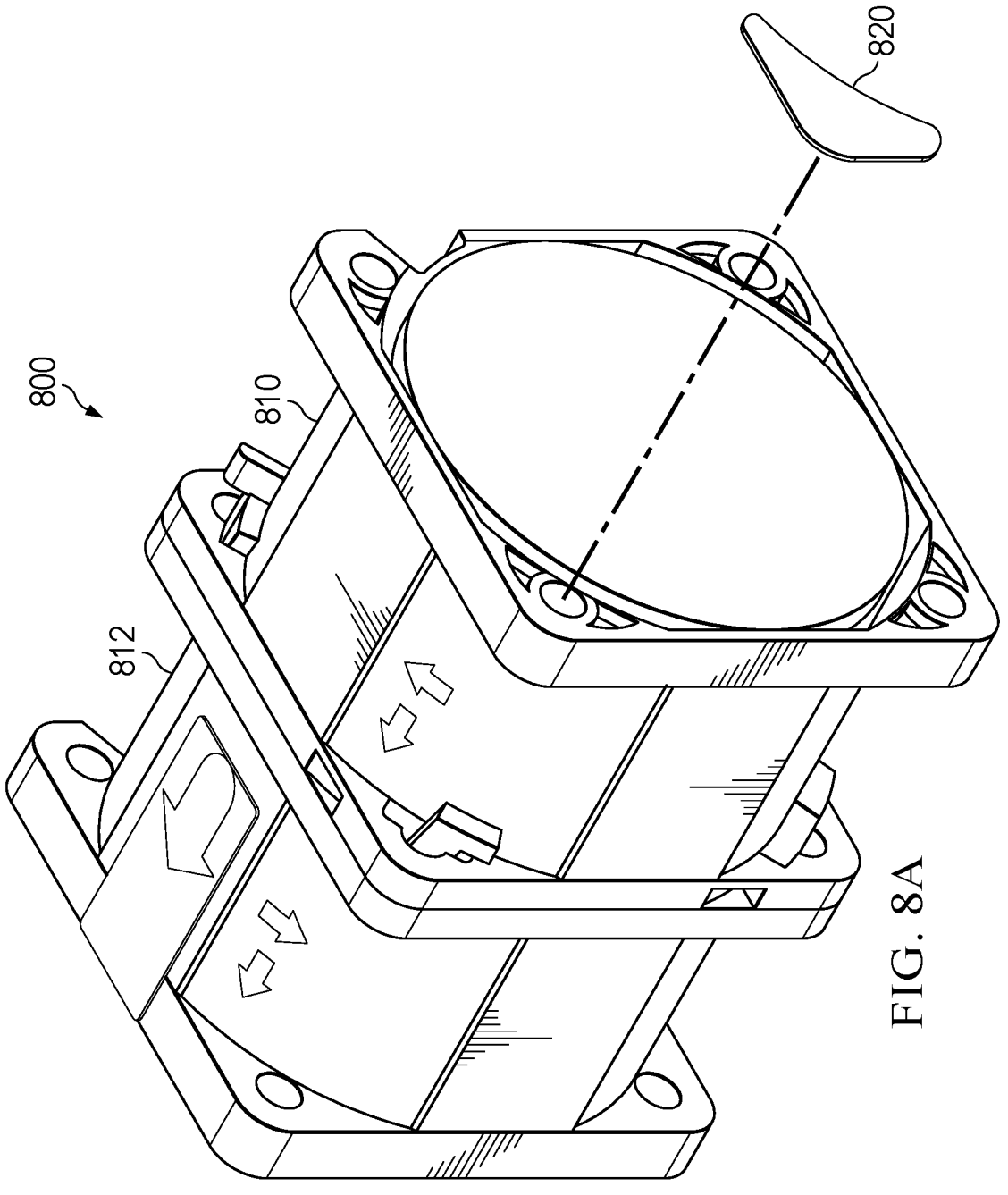
FIGS. 8A and 8B, generally referred to as FIG. 8, show perspective view of a fan module of a fan system in accordance with the present disclosure.
Figure 8B:
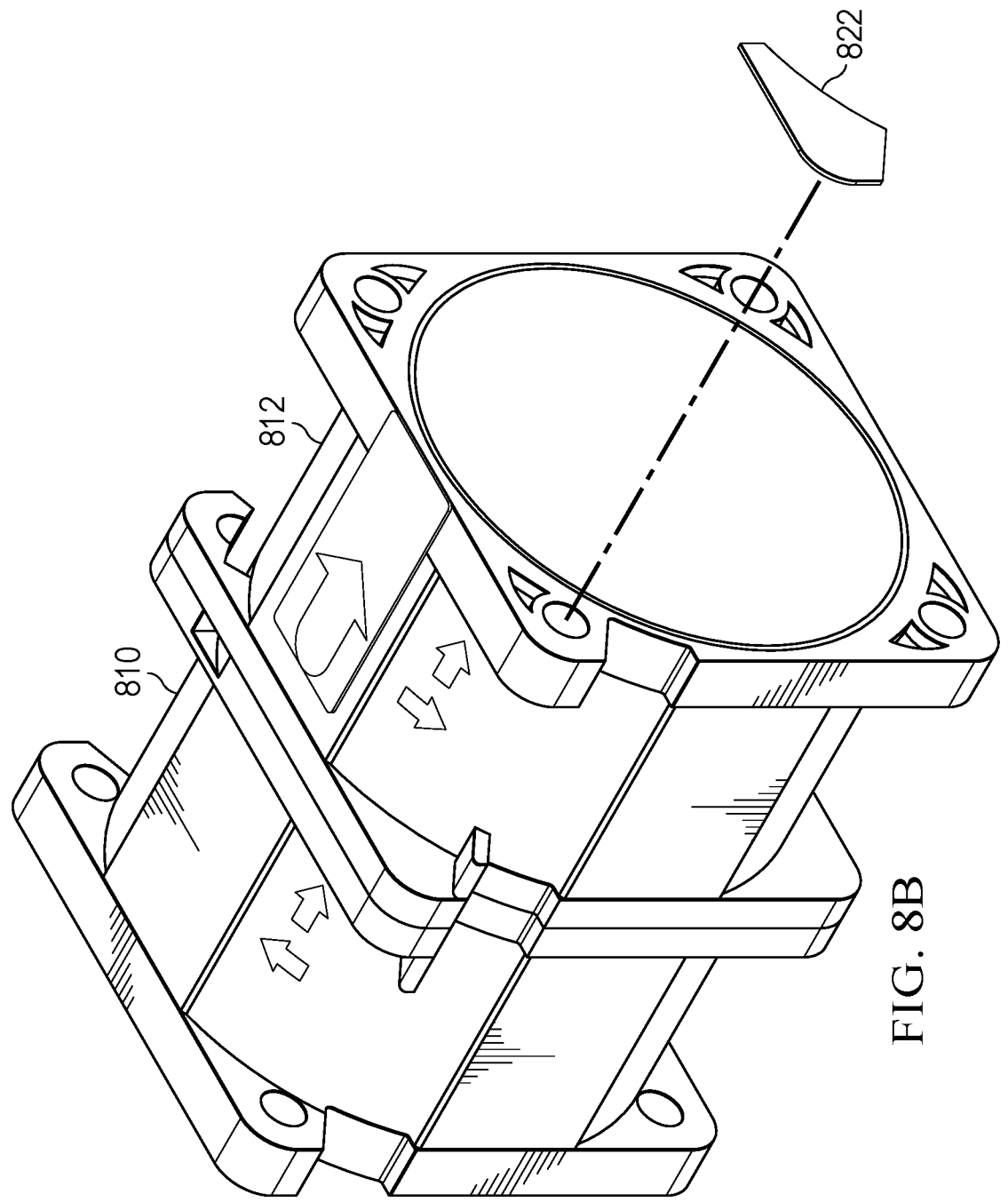

FIGS. 8A and 8B, generally referred to as FIG. 8, show perspective view of a fan module 800 of a fan system in accordance with the present disclosure. More specifically, FIG. 8A shows a fan module 800 in a reverse airflow orientation and FIG. 8B shows a fan module 800 in a normal airflow orientation. In certain embodiments, the fan module 800 is configured to fit within a fan chassis bay in a plurality of orientations to generate airflow in a plurality of direction. In certain embodiments, the plurality of orientations include a forward airflow orientation and a reverse airflow orientation.

In certain embodiments, a fan module 800 includes a pair of fan components 810, 812. In certain embodiments, each of the fan components has fan blades rotating in a particular direction to direct airflow through the fan module 810. In certain embodiments, the pair of fan components 810, 812 has counter rotating blades (e.g., the set of blades for one fan component rotate in a clockwise direction and the set of fan blades for another fan component rotate in a counter clockwise direction).

In certain embodiments, the fan module 800 includes reflective material 820, 822 which is used by the fan orientation sensor to detect fan module orientation. In certain embodiments, different reflective material is used on respective sides of a fan housing of the fan module 800. In certain embodiments, a material which provides high reflectivity is used on one side of the fan housing of the fan module. In certain embodiments, a material which provides low reflectivity is used on one side of the fan housing of the fan module. In certain embodiments, the material which provides high reflectivity includes a glossy surface. In certain embodiments, the glossy surface provides a substantially mirroring (i.e., +/−20%) reflection. In certain embodiments, the material which provides low reflectivity includes a matte surface. In certain embodiments, the matte surface provides a substantially diffuse (i.e., +/−20%) reflection. In certain embodiments, the reflective material 810, 812 are physically attached to a side of the housing of the fan module by adhesive. In certain embodiments, the fan sensor circuit interacts with the reflective material to determine a fan module orientation. In certain embodiments, the high reflectivity and the low reflectivity are used to differentiate an orientation of the fan module.

In certain embodiments, the reflective material may be attached to a corner of a housing of the fan module. In certain embodiments, the reflective material may be attached to an upper corner of the housing of the fan module. In certain embodiments, the reflective material may be attached to alternating corners of adjacent fan modules (e.g., to a right corner of a first fan module and a left corner of a second adjacent fan module). By being so attached, the orientation of pairs of fan modules may be detected using a single respective light emitter and detector.

Other embodiments are within the following claims. For example, in certain embodiments, only one side of a fan module may be provided with reflective material. In this example, the lack of reflectivity would indicate to the light sensor a reverse orientation of the fan module.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A fan system for an information handling system, comprising:
   a fan module, the fan module being configured to mount in a fan bay of the information handling system in a plurality of orientations; and,
   a fan orientation sensor, the fan orientation sensor being configured to detect an orientation of the fan module when mounted within the fan bay of the information handling system, the fan orientation sensor comprising a fan sensor circuit board, a width of the fan sensor circuit board substantially corresponding to a width of the fan module.

2. The fan system of claim 1, wherein:
the fan orientation sensor comprises a light sensor module.

3. The fan system of claim 2, wherein:
the light sensor module comprises one or more of an infrared emitter, a photo detector for proximity and ambient light sensing, a signal processing integrated circuit, and an analog to digital converter.

4. The fan system of claim 1, wherein:
the fan orientation sensor comprises an orientation indicia.

5. The fan system of claim 1, wherein:
the fan module comprises a reflective portion, the reflective portion being used by the fan orientation sensor to detect the orientation of the fan module.

6. The fan system of claim 1, wherein:
the plurality of orientations comprise a forward airflow orientation and a reverse airflow orientation.

7. An information handling system comprising:
a chassis;
a processor mounted within the chassis;
a data bus coupled to the processor;
a storage medium coupled to the data bus; and,
a fan system mounted within a fan bay of the chassis, the fan system comprising
   a fan module, the fan module being configured to mount in a fan bay of the information handling system in a plurality of orientations; and,
   a fan orientation sensor, the fan orientation sensor being configured to detect an orientation of the fan module when mounted within the fan bay of the information handling system, the fan orientation sensor comprising a fan sensor circuit board, a width of the fan sensor circuit board substantially corresponding to a width of the fan module.

8. The information handling system of claim 7, wherein:
the fan orientation sensor comprises a light sensor module.

9. The information handling system of claim 8, wherein:
the light sensor module comprises one or more of an infrared emitter, a photo detector for proximity and ambient light sensing, a signal processing integrated circuit, and an analog to digital converter.

10. The information handling system of claim 7, wherein:
the fan orientation sensor comprises an orientation indicia.

11. The information handling system of claim 7, wherein:
the fan module comprises a reflective portion, the reflective portion being used by the fan orientation sensor to detect the orientation of the fan module.

12. The information handling system of claim 7, wherein:
the plurality of orientations comprise a forward airflow orientation and a reverse airflow orientation.

13. A server rack comprising:
a server mounting component, a front of the server mounting component facing a cold aisle of a data center and a rear of the server mounting component facing a hot aisle of the data center; and,
an information handling system attached to the server mounting component, the information handling system comprising
   a chassis;
   a processor mounted within the chassis;
   a data bus coupled to the processor;
   a storage medium coupled to the data bus; and,
   a fan system mounted within a fan bay of the chassis, the fan system comprising
      a fan module, the fan module being configured to mount in a fan bay of the information handling system in a plurality of orientations; and,
      a fan orientation sensor, the fan orientation sensor being configured to detect an orientation of the fan module when mounted within the fan bay of the information handling system, the fan orientation sensor comprising a fan sensor circuit board, a width of the fan sensor circuit board substantially corresponding to a width of the fan module.

14. The server rack of claim 13, wherein:
the fan orientation sensor comprises a light sensor module.

15. The server rack of claim 14, wherein:
the light sensor module comprises one or more of an infrared emitter, a photo detector for proximity and ambient light sensing, a signal processing integrated circuit, and an analog to digital converter.

16. The server rack of claim 13, wherein:
the fan orientation sensor comprises an orientation indicia.

17. The server rack of claim 13, wherein:
the fan module comprises a reflective portion, the reflective portion being used by the fan orientation sensor to detect the orientation of the fan module.

18. The server rack of claim 13, wherein:
the plurality of orientations comprise a forward airflow orientation and a reverse airflow orientation.

* * * * *